(12) United States Patent
Höfling et al.

(10) Patent No.: US 10,153,453 B2
(45) Date of Patent: Dec. 11, 2018

(54) ELECTRONIC DEVICE

(71) Applicant: OSRAM OLED GmbH, Regensburg (DE)

(72) Inventors: Egbert Höfling, Regensburg (DE); Simon Schicktanz, Regensburg (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 15/032,879

(22) PCT Filed: Nov. 26, 2014

(86) PCT No.: PCT/EP2014/075668
§ 371 (c)(1),
(2) Date: Apr. 28, 2016

(87) PCT Pub. No.: WO2015/078914
PCT Pub. Date: Jun. 4, 2015

(65) Prior Publication Data
US 2016/0285031 A1  Sep. 29, 2016

(30) Foreign Application Priority Data
Nov. 28, 2013  (DE) .................. 10 2013 113 190

(51) Int. Cl.
*H01L 51/52* (2006.01)
*H01L 51/00* (2006.01)

(52) U.S. Cl.
CPC ...... *H01L 51/5203* (2013.01); *H01L 51/0096* (2013.01); *H01L 51/5253* (2013.01); *H01L 2251/5315* (2013.01); *H01L 2251/5361* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| 9,105,863 | B2 | 8/2015 | Goeoetz et al. | |
| 2006/0006404 | A1* | 1/2006 | Ibbetson | H01L 23/481 257/99 |
| 2006/0087224 | A1* | 4/2006 | Oki | H01L 27/3276 313/504 |

(Continued)

FOREIGN PATENT DOCUMENTS

| DE | 102010002398 A1 | 9/2010 |
| DE | 102011076733 A1 | 12/2012 |

(Continued)

*Primary Examiner* — Michael Lebentritt
*Assistant Examiner* — Jordan Klein
(74) *Attorney, Agent, or Firm* — Slater Matsil, LLP

(57) ABSTRACT

An electronic component includes a connection carrier having a cover surface, a first electric connection point and a second electric connection point, and an organic active area. A first electrode interconnects in an electrically conductive manner the active area and the first electric connection point. An encapsulation layer protects the active area against humidity and atmospheric gases. The electronic component can be contacted from the outside by the electric connection points and the encapsulation layer is in direct contact, in places, with the connection carrier.

26 Claims, 3 Drawing Sheets

(56) References Cited

U.S. PATENT DOCUMENTS

| | | | | |
|---|---|---|---|---|
| 2008/0265759 A1* | 10/2008 | Young | ............... | H01L 51/5203 |
| | | | | 313/504 |
| 2010/0213828 A1* | 8/2010 | Seo | ................ | H01L 51/5253 |
| | | | | 313/504 |
| 2010/0276706 A1* | 11/2010 | Herrmann | ......... | H01L 33/0079 |
| | | | | 257/89 |
| 2011/0299232 A1* | 12/2011 | Schumann | ......... | H01L 23/3121 |
| | | | | 361/679.01 |
| 2013/0016054 A1* | 1/2013 | Cheong | ................ | G06F 3/044 |
| | | | | 345/173 |
| 2013/0075777 A1* | 3/2013 | Fan | ................ | H01L 51/0096 |
| | | | | 257/99 |
| 2013/0193871 A1* | 8/2013 | Jobert | ............... | H01L 51/5212 |
| | | | | 315/291 |
| 2014/0203253 A1* | 7/2014 | Goeoetz | ............ | H01L 51/5203 |
| | | | | 257/40 |
| 2014/0217391 A1* | 8/2014 | Hayasaki | ............ | H01L 51/524 |
| | | | | 257/40 |
| 2015/0108531 A1* | 4/2015 | Schwarz | ........... | H01L 21/4828 |
| | | | | 257/99 |
| 2015/0270459 A1* | 9/2015 | Dirscherl | ............... | H01L 33/56 |
| | | | | 257/98 |

FOREIGN PATENT DOCUMENTS

| | | |
|---|---|---|
| DE | 102011077687 A1 | 12/2012 |
| DE | 102012202924 A1 | 8/2013 |
| EP | 2282360 A1 | 2/2011 |
| JP | 200632058 A | 2/2006 |
| WO | 2011073189 A2 | 6/2011 |
| WO | 2012133807 A1 | 10/2012 |
| WO | 2013051230 A1 | 4/2013 |

* cited by examiner

ELECTRONIC DEVICE

This patent application is a national phase filing under section 371 of PCT/EP2014/075668, filed Nov. 26, 2014, which claims the priority of German patent application 10 2013 113 190.5, filed Nov. 28, 2013, each of which is incorporated herein by reference in its entirety.

TECHNICAL FIELD

An electronic device is provided.

BACKGROUND

Patent publication DE 10 2011 076 733 A1 describes an electronic device.

SUMMARY OF THE INVENTION

Embodiments of the invention provide an electronic device that is particularly versatile in use.

According to at least one embodiment of the electronic device, the electronic device comprises a connection carrier. The connection carrier comprises a cover surface, a bottom surface opposite the cover surface, as well as side surfaces, which connect the cover surface and the bottom surface with each other. The connection carrier also comprises a first electric connection point and a second electric connection point. The connection points of the connection carrier allow the electronic device to be contacted from outside the electronic device. That means the electronic device can be contacted from outside via the electric connection points.

The connection carrier concerned is particularly the mechanically supporting and carrying component of the electronic device. That means the components of the electronic device, which are mechanically supported, carried and held together by the connection carrier, are in particular arranged on the cover surface of the connection carrier. The connection carrier can, for example, be designed as a type of board, i.e., the lateral expansion of the connection carrier in its main direction of extension is large compared to the vertical extension of the connection carrier perpendicular to its main extension plane. The connection carrier can have a rectangular base area, for example.

According to at least one of the embodiments of the electronic device, the electronic device comprises an organic, active area, which is provided for generating and/or for receiving electromagnetic radiation, for example. The electronic device concerned can be an optoelectronic device, such as an organic light-emitting diode (OLED) and/or an organic photo diode, for example. The electronic device concerned may also be an electronic microcontroller or another organic power device.

The connection carrier can constitute a substrate of the electronic device. That means the components of the electronic device, particularly the organic, active area and electrodes for contacting the organic, active area, are directly attached on the connection carrier, for example, the components of the electronic device are generated directly on the cover surface of the connection carrier. The connection carrier then constitutes the only mechanically supporting component of the electronic device and the organic, active area is not attached to a further substrate.

According to at least one embodiment of the electronic device, the electronic device comprises a first electrode connecting the active area and the first electric connection point with each other in an electrically conductive manner.

For example, the first electrode can be directly connected with the first connection point and the active area. The first electrode can at least in places be designed in a manner allowing radiation permeation or allowing radiation reflection. To that end, the first electrode can be formed with a metal and/or a transparent conductive oxide, such as ITO (indium tin oxide). The first electrode can particularly be in extensive contact with the organic, active area. That means the first electrode can extensively cover a cover surface or a bottom surface of the active area. For example, the first electrode can cover at least 50%, in particular at least 75%, of a cover surface or of a bottom surface of the active area. The cover surface and bottom surface of the active area can thereby be arranged parallel to the cover surface of the connection carrier within the scope of the manufacturing tolerance. The first electrode can in particular fully cover the cover surface or the bottom surface of the active area. The first electrode may also be formed with a plurality of materials, and therefore the first electrode can be formed with a transparent conductive oxide and a metal. The first electrode can in places be in direct contact with the connection carrier on the cover surface thereof.

According to at least one embodiment of the electronic device, the electronic device comprises an encapsulation layer that protects the active area against humidity and atmospheric gases. The encapsulation layer can, for example, be a so-called thin film encapsulation. The encapsulation layer can be generated by a deposition process, such as chemical vapor deposition, physical vapor deposition, sputtering, atomic layer deposition (ALD) or other deposition methods. In particular, the encapsulation layer can contain at least one ALD (atomic layer deposition) layer, produced by an ALD process. That means at least this encapsulation layer is made by means of an ALD process.

An ALD process allows very thin layers to be generated, which have a polycrystalline or amorphous structure. A layer produced by means of ALD grows in proportion to the number of reaction cycles with which the layer is produced, thus enabling the layer thickness to be exactly controlled. The ALD process allows particularly uniform layers to be produced, i.e., layers of a particularly uniform thickness. Furthermore, the monolayer growth with the ALD process produces very dense layers with very few crystal defects.

In other words, at least one encapsulation layer is deposited with the aid of an ALD process, such as Flash ALD, photo-induced ALD or another ALD process.

Electro-microscopic examinations and other analysis methods of semiconductor technology enable an encapsulation layer produced by means of an ALD process to be clearly distinguished from layers produced via alternative methods, such as, for example, conventional CVD (chemical vapor deposition). The feature according to which the encapsulation layer is an ALD layer is thus an objective feature that can be verified by means of the finished electronic semiconductor chip.

The encapsulation layer, which is an ALD layer, is formed with an electrically insulating material and has, for example, a thickness of between 0.05 nm and a maximum of 500 nm, in particular between at least 30 nm and a maximum of 50 nm, for example, a thickness of 40 nm. The encapsulation layer may comprise multiple sublayers, which are arranged on top of each other. The encapsulation layer contains or consists, for example, of one of the following materials: $Al_2O_3$, $SiO_2$, SiN. It may also be particularly possible that the encapsulation layer, which is an ALD layer, contains a combination of such materials.

The encapsulation layer inhibits humidity and/or atmospheric gases from penetrating the organic, active area through the encapsulation layer from the area surrounding the electronic device. For this purpose, the encapsulation layer is thus arranged around the active area. For example, the active area is then completely cut off from the surrounding area by the encapsulation layer and another component of the electronic device, for example, the connection carrier. The encapsulation layer can thereby also cover other components of the electronic device, such as the first electrode or further electrodes, for example. The encapsulation layer can in particular be in direct contact in places with components of the electronic device, such as, for example, the active area or electrodes of the electronic device.

The encapsulation layer is at least partially designed to be permeable for the electromagnetic radiation to be emitted or detected in the active area. The encapsulation layer can, for example, be designed in a clear, transparent manner.

According to at least one embodiment of the electronic device, the encapsulation layer is in direct contact with the connection carrier in places. That means the encapsulation layer directly covers the connection carrier in places, and therefore the remaining components of the electronic device can all be arranged between connection carrier and the encapsulation layer, thus allowing the encapsulation layer together with the connection carrier to constitute a wrapping for the remaining components of the electronic device.

According to at least one embodiment of the electronic device, the electronic device comprises a connection carrier with a cover surface and a first electric connection point, as well as a second electric connection point. The electronic device also includes an organic, active area, which is provided for generating and/or receiving electromagnetic radiation and is arranged on the cover surface of the connection carrier. The electronic device also comprises a first electrode, which connects the active area and the first electric connection point with each other in an electrically conductive manner, as well as an encapsulation layer, which protects the active area against humidity and atmospheric gases. The electronic device can thereby be contacted from outside via the electric connection points of the connection carrier and the encapsulation layer is in direct contact with the connection carrier in places.

In an electronic device described here the connection carrier, which has the electric connection points for contacting the electronic device from outside, constitutes the carrier for the organic, active area. The components of the electronic device can in particular be directly attached on the connection carrier, and therefore the connection carrier constitutes the substrate for the electrodes and the organic, active area. That means the electronic device can be directly processed on the carrier, via which the electric contact for operating the components of the electronic device is established.

The electronic device has an encapsulation layer, which protects the active area against humidity and atmospheric gases, wherein the electric connection points of the electronic device remain free of this encapsulation layer during the production of the electronic device. That means the encapsulation layer needs not be opened to connect the electronic device, instead the electric connection points remain uncovered by the encapsulation layer.

The electric connection points can be designed in various different ways on the connection carrier, thus allowing particularly versatile use of the electronic device.

Electronic devices described here, which in particular comprise an organic, active area, require an electrical and mechanical connection with the system in which they are operated. High device efficiency as well as stable electro-optic properties require an electrical connection with a low and permanently stable electrical resistance. The mechanical connection should be able to resist stresses such as tensile forces, compressive forces and shear forces or vibrations, without the connection to the system or within the device breaking.

It has been demonstrated that in particular the use of a connection carrier as a mechanically supporting and carrying component of the electronic device allows an easy handling and a particularly easy and cost-effective system integration of the electronic device. For example, the connection points can be designed in the form of plug contacts or SMT contacts for this purpose. The electrical and mechanical connection functions are then particularly cost-effective.

Furthermore, the proportion of the non-active area in an electronic device described here can be kept very small. For this purpose, the organic, active area can have a cross-sectional area equaling at least 75% and preferably at least 85% of the cover surface of the connection carrier. That means almost the entire cover surface of the connection carrier can be occupied by the active area, thus making the proportion of non-active area in the electronic device very small.

Furthermore, the connection points in an electronic device described here are integrated in the connection carrier and are not retroactively attached by techniques, such as bonding, soldering, welding or adhesion, thus reducing the resistance between the connection point and the electrodes for the present organic, active area.

As the connection points remain free from the encapsulation layer at all times during the production of the electronic device, the encapsulation need not be removed or broken through before a measuring process for determining the electronic properties of the electronic device and/or before connecting the device. As a removal or breakthrough of the encapsulation layer involves higher process costs and losses in yield, as the organic layers and/or the encapsulation layer may be damaged and an electro-optic characterization of the electronic device in the production process is delayed by a prior removal or breakthrough of the encapsulation layer, an electronic device described here is distinguished by particularly high profitability in production.

According to at least one embodiment of the invention, the connection carrier is designed with at least two electrically conductive solid bodies, which are connected with each other by at least one electrically insulating connecting element. The connection carrier thus includes at least two electrically conductive elements, i.e., the solid bodies. The electrically conductive solid bodies are arranged laterally spaced apart to each other and connected with each other by at least one electrically insulating connecting element. For example, the side surfaces of the solid bodies can be embedded in the electrically insulating connecting element. The electrically conductive solid bodies are then free from the electrically insulating connecting element on their cover area facing the active area and on their ground area facing away from the active area. That means the solid bodies can in particular extend completely through the connection carrier and are freely accessibly on their top side and the bottom side.

The electrically conductive solid bodies are, for example, formed with a metal or consist of a metal. The at least one electrically insulating connecting element can be formed with a glass, a ceramic material or a plastic material.

The electrically conductive solid bodies are preferably in direct contact with the electric connection points of the connection carrier or every electric connection point of the connection carrier is formed by an area of an electrically conductive solid body of the connection carrier. Furthermore, the electrically conductive solid bodies are in electrically conductive contact with the electrodes for contacting the active area, in particular in direct contact, wherein at least one of the electrodes can also be formed by one of the solid bodies.

According to at least one embodiment of the electronic device, the electric connection points are designed on a bottom surface facing away from the cover surface and/or on a side surface of the connection carrier running transversely to the cover surface. For example, the electric connection points can be formed by the bottom surfaces of the electrically conductive solid bodies facing away from the active area. The electrically conductive solid bodies may also protrude on at least one side surface of the connection carrier and be designed there as pins or bushes for a plug connection. However, the pins or bushes can also be embedded in at least one of the solid bodies, and therefore no element exceeds the side surface of the device.

That means, the electrically conductive solid bodies of the connection carrier thus form side contact bodies, which are coded according to the electrical polarity and/or contain a latching function and/or can be curved downwards towards the bottom surface of the connection carrier and/or upwards towards the cover surface of the connection carrier.

Depending on the material used to form the electrically insulating connecting element, the connection carrier can be designed in a flexible or rigid manner. The connection carrier is in particular not provided to allow radiation to exit or enter and can thus in particular also be designed in a reflecting manner. For this purpose, a base material of the electrically insulating connecting element can, for example, be filled with radiation-reflecting or radiation-dispersing particles, such as titanium dioxide. The electrically insulating connecting element can then seem white, for example. The electrically conductive solid bodies can be formed with a reflecting material, in particular a reflecting metal. In addition, the connection carrier may have a reflecting layer on its cover surface facing the active area or a reflecting layer may be designed on the connection carrier between the active area and the connection carrier. The reflecting layer can also assume the function of an electrode for electrically connecting the active area.

According to at least one embodiment of the electronic device, the electric connections can be electrically connected via a plug connection. In particular, the electric connections may be designed as a plug connection. Different polarities of the electric connection points can be coded by a different embodiment of the plug connection in such a way as to prevent a connection of the electronic device with incorrect polarity via the plug connection. For example, the plug connections can be formed by correspondingly designed areas of the electrically conductive solid bodies of the connection carrier.

According to at least one embodiment of the electronic device, the active area is directly adjacent to the connection carrier in places and is directly connected with the connection carrier in an electrically conductive manner. The connection carrier in this embodiment constitutes an electrode of the active area. That means no other material is then arranged in places between connection carrier and active area, instead the active area is directly energized by the connection carrier. The active area is then directly adjacent to the cover surface of the connection carrier in places.

For example, one of the electrically conductive solid bodies can be in direct contact with the active area for this purpose. Such electrically conductive solid bodies can have a cover surface facing the active area with a surface area of at least 50%, in particular at least 75%, of the cross-sectional surface of the active area. That means the active area is extensively energized by the solid bodies in this embodiment. The embodiment is advantageous, particularly with regard to a good cooling of the active area during the operation of the electronic device. A large proportion of the heat generated during operation can be efficiently discharged by the electrically conductive solid bodies.

According to at least one embodiment of the electronic device, an electrically insulating buffer layer is arranged in places between the active area and the cover surface of the connection carrier. The electrically insulating buffer layer can cover areas of the electrically conductive solid bodies as well as of the electrically insulating connecting element and can also be in direct contact with these. The buffer layer can in places be in direct contact with the connection carrier on the cover surface thereof. The buffer layer can thereby have encapsulating properties and protect the active layer against humidity and atmospheric gases. The buffer layer can also have planarization functions, i.e., it can balance out any irregularities on the cover surface of the connection carrier. In one embodiment in which the active area is directly adjacent to the connection carrier in places, the buffer layer can have a gap in this area or not be present, and therefore, for example, one of the electrically conductive solid bodies can constitute an electrode for contacting the active area.

According to at least one embodiment of the electronic device, the buffer layer is an ALD layer or the buffer layer includes an ALD layer. Should the buffer layer be an ALD layer, it is particularly well suited for protecting the active layer against humidity and atmospheric gases.

According to at least one embodiment of the electronic device, the encapsulation layer is an ALD layer or comprises an ALD layer. It is thus particularly possible that the encapsulation layer and the buffer layer are similarly constructed. That means the encapsulation layer and the buffer layer can include the same sequence of different layers, for example. In particular, buffer layer and encapsulation layer can include a plurality of layers and in particular a plurality of ALD layers, which are stacked one above the other.

According to at least one embodiment of the electronic device, the device comprises a second electrode, which connects the active area and the second electric connection point with each other in an electrically conductive manner, wherein the second electrode is arranged between the connection carrier and the active area and the first electrode is arranged on the side of the active area facing away from the connection carrier. The first electrode is thereby at least in places designed in a radiation-permeable manner, thus allowing electromagnetic radiation to be generated or received in operation to pass through the first electrode.

The second electrode can, for example, be arranged between the connection carrier and the active area and cover the active area as completely as possible or completely on the bottom surface facing the connection carrier.

The second electrode can be designed in a radiation-reflecting manner, and therefore be established for reflecting electromagnetic radiation to be generated or to be detected in the active area.

According to at least one embodiment of the electronic device, the electronic device comprises at least one through connection through the buffer layer in which at least one of the electrodes penetrates the buffer layer. That means the buffer layer is open in at least one place and the material of at least one electrode permeates the buffer layer in the opening. For example, the buffer layer may thus completely cover the cover surface of the connection carrier facing the active area and only have openings to the connection carrier in the area of the through connections. The through connections through the buffer layer can be produced by laser ablation, for example.

According to at least one embodiment of the electronic device, the active area is completely enclosed by ALD layers, aside from the through connections through the buffer layer. The electronic device in such embodiment includes a buffer layer as well as an encapsulation layer, which each contain at least one ALD layer. The buffer layer and the encapsulation layer are, for example, directly adjacent to each other on the sides of the electronic device on the connection carrier. The buffer layer completely covers the connection carrier, aside from the through connections to the electrodes, and the encapsulation layer completely covers the surface of the remaining components of the electronic device facing away from the connection carrier. The active area, which contains an organic material, is thus completely surrounded by ALD layers. Such an electronic device is distinguished by a particularly high durability, as the active area is particularly well-protected against humidity and atmospheric gases.

According to at least one embodiment of the electronic device, the electrically conductive solid bodies of the connection carrier are connected without joining means with the at least one electrically insulating connecting element. The solid bodies can, for example, be connected by injection molding with the at least one electrically insulating connecting element, and therefore no other connecting material is arranged between the solid bodies and the at least one connecting element. Alternatively, the at least one electrically insulating connecting material can be adhered or sintered.

According to at least one embodiment of the electronic device, the connection carrier is designed as a foil. For example, the connection carrier concerned can be a combination of metal and plastic films, thus allowing the connection carrier to be designed in a particularly thin and flexible manner.

According to at least one embodiment of the electronic device, the electronic device has separation traces on its side surfaces. For example, a multiplicity of electronic devices can be processed simultaneously on a single connection carrier structure. After producing the encapsulation by attaching the encapsulation layer, separation into individual electronic devices right through the encapsulation layer and the connection carrier can ensue. In such case, at least the connection carrier on the side surfaces of the electronic device has traces of a separation process, for example a laser separation. Furthermore, the separating process can form connection points designed as bushes or plugs on the side surfaces of the connection carrier, which can be electrically contacted via a plug connection.

In particular, the electrically conductive solid bodies form the external surface of the electronic device in places. That means the electronic device is laterally limited in the area of the connection carrier by the electrically conductive solid bodies.

BRIEF DESCRIPTION OF THE DRAWINGS

The electronic device described here is explained in more detail in the following based on embodiments and the associated figures.

Exemplary embodiments of an electronic device described here are explained in more detail based on the schematic sectional illustrations of FIGS. 1 and 2.

Further exemplary embodiments of electronic devices described here are explained in more detail based on the schematic sectional illustrations and views of connection carriers of electronic devices described here according to FIGS. 3A, 3B, 4 and 5.

In the exemplary embodiments and figures, similar or similarily acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

DETAILED DESCRIPTION OF ILLUSTRATIVE EMBODIMENTS

Figure 1:
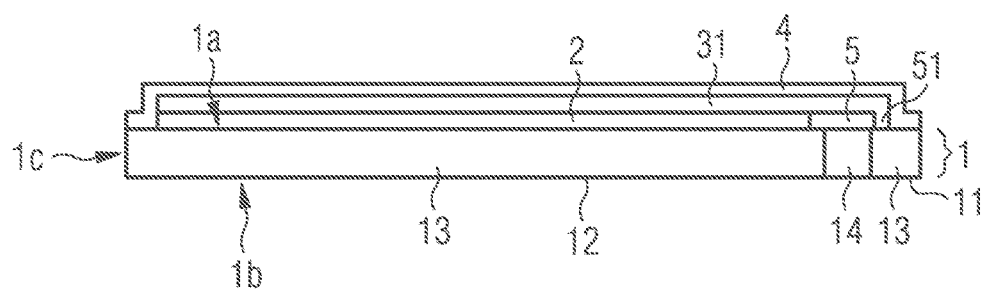

The schematic sectional view of FIG. 1 shows an embodiment of an electronic device described here. The electronic device includes a connection carrier 1. The connection carrier 1 includes a cover surface 1a, a bottom surface 1b as well as the side surfaces 1c connecting the cover surface and the bottom surface.

In the present embodiment the connection carrier comprises two electrically conductive elements, which are presently designed as electrically conductive solid bodies 13. The electrically conductive solid bodies 13 consist of a metal, for example. The first connection point 11 and the second connection point 12 are arranged on the bottom sides of the electrically conductive solid bodies 13. The electronic device can be contacted from outside via the two connection points. A surface-mount by means of a surface-mounting technology would be possible in the embodiment of FIG. 1, for example.

The two electrically conductive solid bodies 13 are presently connected with each other by an electrically insulating connecting element 14, which, for example, is formed with a plastic such as epoxide resin or a silicone, which is connected without joining means with the electrically conductive solid bodies 13 by injection molding.

The electronic device also has an active area 2, which comprises an organic material. The electronic device can, for example, be provided for generating radiation or for receiving radiation, wherein the radiation is generated and received respectively in the active area 2. The electronic device concerned is then an organic light diode or an organic photodiode, for example.

The electronic device further comprises a first electrode 31. The first electrode 31 is connected with one of the electrically conductive solid bodies 13 as well as the first connection point 11 in an electrically conductive manner and is, for example, in direct contact with an electrically conductive solid body 13. Between the first electrode 31 and the connection carrier 1 a buffer layer 5 is at least arranged in the area of the electrically insulating connecting element 14, the buffer layer 5 being electrically insulating.

The buffer layer 5 can be generated by imprinting and/or a deposition technique. In particular, the buffer layer 5 can include at least one ALD layer. The buffer layer 5 completely covers the electrically insulating connecting element 14 and also covers the transition between electrically insulating connecting element 14 and electrically conductive solid bodies 13. This allows the buffer layer 5, in particular when it includes at least one ALD layer, to seal possible leaks between the electrically conductive solid bodies 13 and the electrically insulating connecting element 14, as the connecting area between these two elements is completely covered.

The buffer layer 5 has at least one through connection 51, through which the first electrode extends. The first electrode 31 runs from the through connection 51 via the buffer layer 5 as well as the active area 2 and, for example completely, covers the active area 2 on the cover surface thereof facing away from the connection carrier 1. In addition, the first electrode 31 can be designed at least partially in a manner allowing radiation to permeate.

The buffer layer 5 is optional in the embodiment in FIG. 1. For example, another possible alternative is that the buffer layer 5 is not present and the active area 2 also extends to the point in FIG. 1 where the buffer layer 5 is shown.

In the embodiment of FIG. 1 the active area 2 with its bottom surface facing the connection carrier 1 is directly adjacent to a solid body 13, which thus forms the second electrode for the electrical connection of the active area 2. For example, the solid body 13 can also be designed in a manner reflecting radiation. A particularly simple large-scale contact with good heat dissipation of the active area 2 is possible in this embodiment.

The electronic device also comprises an encapsulation layer 4, which can contain at least one ALD layer. The encapsulation layer 4 is adjacent to the connection carrier 1 in places. The active area 2 is protected against humidity and atmospheric gases by the encapsulation layer 4.

Figure 2:
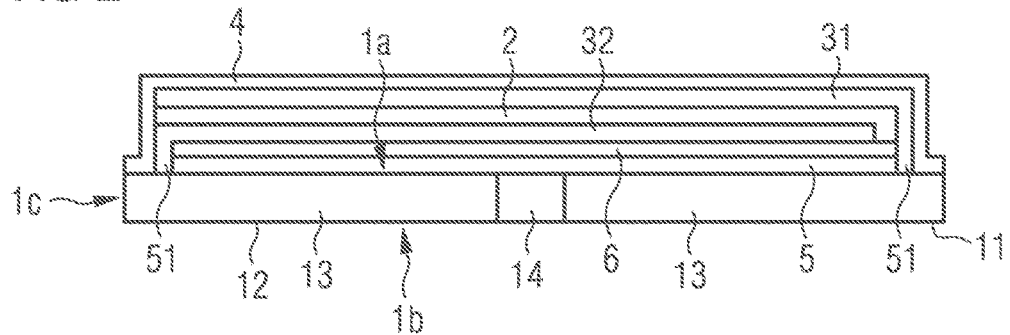

Unlike the embodiment in FIG. 1, the buffer layer 5 in the embodiment in FIG. 2 almost completely covers the cover surface of connection carrier 1 and is only interrupted by the through connections 51 for contacting the electrodes 31, 32. The encapsulation layer 4 and the buffer layer 5 are directly adjacent to each other on the cover surface 1a of the connection carrier in the peripheral area of the electronic device, and therefore the active area 2 is completely encompassed by the buffer layer 5 and the encapsulation layer 4, aside from the through connections 51. In this embodiment it is particularly possible that the buffer layer 5 and the encapsulation layer 4 contain at least one ALD layer or consist of at least one ALD layer.

The embodiment in FIG. 2 also contains a second electrode 32, which is arranged on the bottom side of the active area 2 facing away from the connection carrier 1. For example, the second electrode 32 is thereby at least in places designed in a radiation-reflecting manner. An electrically insulating planarization layer 6 can be arranged on the buffer layer 5 between the two electrodes 32 and the connection carrier 1, with the planarization layer 6 completely covering the buffer layer 5 and balancing out any irregularities of the connection carrier 1 and/or of the buffer layer 5. The planarization layer 6 is optional and may also form a part of the buffer layer 5.

Figure 3A:
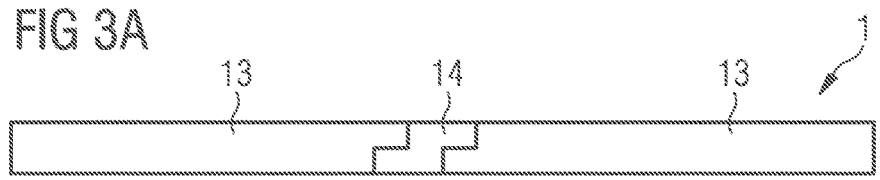
Figure 3B:
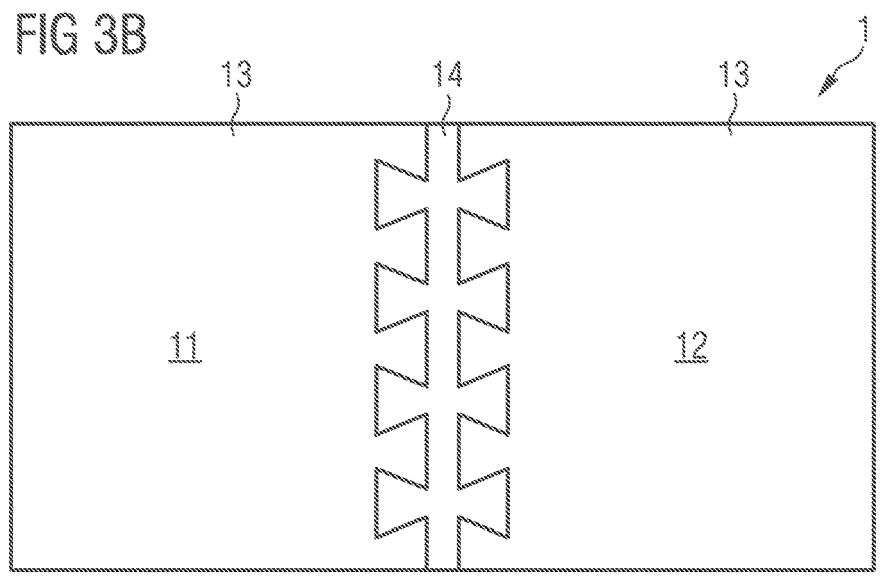

An embodiment for a connection carrier of an electronic device described here is shown in connection with FIGS. 3A and 3B based on a schematic sectional illustration as well as a schematic view. The solid bodies 13 in this embodiment are connected to each other by an electrically insulating connecting element 14, which is intermeshed with the solid bodies 13 by a structuring of the solid bodies 13 on the mutually facing side surfaces. The electrically insulating connecting element can, for example, be connected by an injection mold process with the solid bodies 13, i.e., the electrically conductive elements of the connection carrier.

Figure 4:
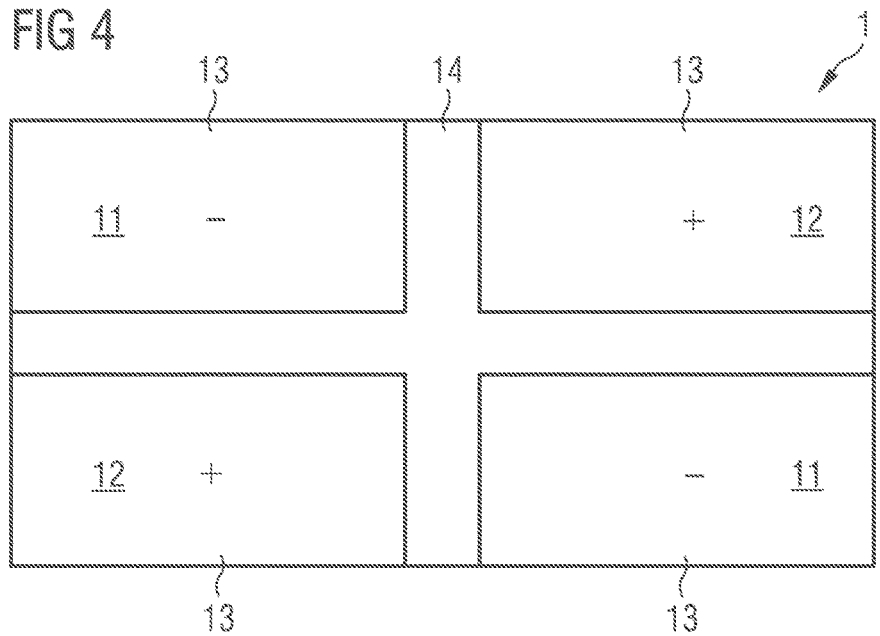

An embodiment of the connection carrier 1 is described in connection with FIG. 4 in which a contact arrangement of the connection points 11, 12 protected against polarity reversal is ensured. The electrically insulating connecting element 14 is cross-shaped in the top view and first and second connection points 11, 12 are arranged on the bottom side of the connection carrier 1 in diagonal quadrants of the cross formed by the connecting element.

Figure 5:
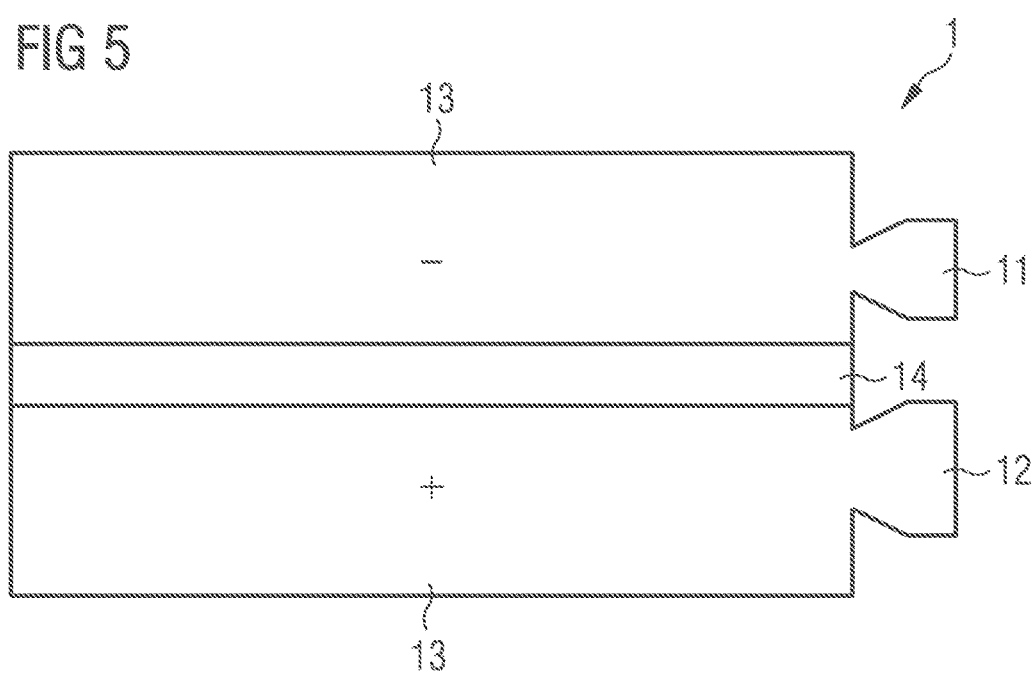

An embodiment of an electronic device described here is described in connection with FIG. 5 based on a schematic top view, in which first and second electric connection points 11, 12 are designed in the form of contact bodies on the side surfaces of the solid bodies 13. The contact bodies can, for example, be plugs or bushes that are differently designed for the differing poling of the connection points, and therefore create an arrangement of the connection points protected against polarity reversal.

The invention is not limited to the embodiments based on the description thereof. Rather, the invention encompasses every new feature as well as every combination of features, which particularly includes every combination of features in the claims, even if such feature or such combination is not explicitly stated in the claims or embodiments.

The invention claimed is:

1. An electronic device comprising:
   a connection carrier comprising a cover surface;
   a first electric connection point;
   a second electric connection point;
   an organic active area on the cover surface;
   a first electrode electrically connecting the active area and the first electric connection point with each other in an electrically conductive manner; and
   an encapsulation layer protecting the active area against humidity and atmospheric gases,
   wherein the electronic device is contactable from outside via the first and second electric connection points,
   wherein the encapsulation layer is in direct contact with the connection carrier in places,
   wherein the connection carrier consists of at least two electrically conductive solid bodies and a single electrically insulating connecting element,
   wherein the at least two electrically conductive solid bodies are connected with each other by the single electrically insulating connecting element, and
   wherein the single electrically insulating connecting element is arranged exclusively between the two electrically conductive solid bodies of the connection carrier.

2. The electronic device according to claim 1, wherein the first and second electric connection points are located a bottom surface facing away from the cover surface.

3. The electronic device according to claim 1, wherein the first and second electric connection points are located a side surface of the connection carrier running transversely to the cover surface.

4. The electronic device according to claim 1, wherein the first and second electric connection points are electrically contacted via a plug connection.

5. The electronic device according to claim 1, wherein the active area is directly adjacent to the connection carrier in places and is directly connected with the connection carrier in an electrically conductive manner.

6. The electronic device according to claim 1, further comprising an electronically insulating buffer layer arranged between the active area and the cover surface of the connection carrier in places.

7. The electronic device according to claim 6, further comprising a through connection extending through the buffer layer, wherein the first electrode and the through connection form an electrical conductor through the buffer layer.

8. The electronic device according to claim 7, wherein the active area is completely encompassed by ALD layers, aside from the through connection through the buffer layer.

9. The electronic device according to claim 6, wherein the buffer layer is configured to protect the active area against humidity and atmospheric gases.

10. The electronic device according to claim 6, wherein the buffer layer comprises an ALD layer.

11. The electronic device according to claim 6, wherein the buffer layer comprises no layer that is not an ALD layer.

12. The electronic device according to claim 1, wherein the encapsulation layer comprises an ALD layer.

13. The electronic device according to claim 1, further comprising a second electrode electrically connecting the active area and the second electrical connection point, wherein the second electrode is arranged between the connection carrier and the active area, and wherein the first electrode is arranged on a side of the active area facing away from the connection carrier.

14. The electronic device according to claim 13, further comprising an electronically insulating buffer layer arranged between the active area and the cover surface of the connection carrier in places.

15. The electronic device according to claim 14, further comprising:
   a first through connection extending through the buffer layer and electrically connected to the first electrode; and
   a second through connection extending through the buffer layer and electrically connected to the second electrode.

16. The electronic device according to claim 1, wherein the active area is configured to generate electromagnetic radiation.

17. The electronic device according to claim 1, wherein the active area is configured to receive electromagnetic radiation.

18. The electronic device according to claim 1, wherein the connection carrier consists of two electrically conductive solid bodies and the single electrically insulating connecting element.

19. The electronic device according to claim 1, wherein the connection carrier consists of four electrically conductive solid bodies and the single electrically insulating connecting element.

20. The electronic device according to claim 1, wherein the encapsulation layer is in direct contact with the first and second electric connection point.

21. The electronic device according to claim 1, wherein the single electrically insulating connecting element is in direct contact which each of the at least two electrically conductive solid bodies.

22. The electronic device according to claim 1, wherein the electrically conductive solid bodies have a cover surface facing the active area with a surface area of at least 50% of a cross-sectional surface of the active area.

23. The electronic device according to claim 1, wherein the electronic device is laterally limited in the area of the connection carrier by the electrically conductive solid bodies.

24. The electronic device according to claim 1, wherein a volume of at least one of the electrically conductive solid bodies is greater than a volume of the electrically insulating connecting element.

25. The electronic device according to claim 1, wherein the first and the second electrical connection points are formed by the electrically conductive solid bodies.

26. The electronic device according to claim 1, wherein a side surface of the encapsulation layer terminates flush with at least one of the side surfaces of the electrically conductive solid bodies.

* * * * *